US010914462B2

(12) United States Patent
Duong

(10) Patent No.: US 10,914,462 B2
(45) Date of Patent: Feb. 9, 2021

(54) SYSTEMS AND METHODS FOR LIGHTING FIXTURES

(71) Applicant: Fluence Bioengineering, Inc., Austin, TX (US)

(72) Inventor: Dung Duong, Bee Cave, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 70 days.

(21) Appl. No.: 16/433,042

(22) Filed: Jun. 6, 2019

(65) Prior Publication Data

US 2019/0316766 A1 Oct. 17, 2019

Related U.S. Application Data

(63) Continuation of application No. 15/684,665, filed on Aug. 23, 2017, now Pat. No. 10,359,183.

(Continued)

(51) Int. Cl.
| | |
|---|---|
| *F21V 23/00* | (2015.01) |
| *H05K 1/05* | (2006.01) |
| *H05K 1/18* | (2006.01) |
| *H05K 1/02* | (2006.01) |
| *H05K 3/32* | (2006.01) |
| *F21K 9/90* | (2016.01) |
| *F21V 29/74* | (2015.01) |
| *F21V 23/04* | (2006.01) |

(Continued)

(52) U.S. Cl.
CPC ............ *F21V 23/005* (2013.01); *A01G 7/045* (2013.01); *F21K 9/232* (2016.08); *F21K 9/90* (2013.01); *F21S 4/28* (2016.01); *F21V 7/005* (2013.01); *F21V 7/0066* (2013.01); *F21V 7/05* (2013.01); *F21V 15/015* (2013.01); *F21V 17/107* (2013.01); *F21V 19/003* (2013.01); *F21V 19/0015* (2013.01); *F21V 23/001* (2013.01); *F21V 23/02* (2013.01); *F21V 23/0442* (2013.01); *F21V 29/70* (2015.01); *F21V 29/74* (2015.01); *F21V 29/83* (2015.01); *H05K 1/0203* (2013.01); *H05K 1/0209* (2013.01); *H05K 1/0274* (2013.01); *H05K 1/0277* (2013.01); *H05K 1/05* (2013.01); *H05K 1/056* (2013.01); *H05K 1/181* (2013.01); *H05K 1/182* (2013.01); *H05K 1/185* (2013.01); *H05K 3/0014* (2013.01); *H05K 3/28* (2013.01); *H05K 3/32* (2013.01); *H05K 3/44* (2013.01); *F21Y 2103/10* (2016.08); *F21Y 2105/16* (2016.08); *F21Y 2115/10* (2016.08); *H05B 45/10* (2020.01); *H05B 47/105* (2020.01); *H05B 47/19* (2020.01); *H05K 2201/066* (2013.01); *H05K 2201/09009* (2013.01); *H05K 2201/10106* (2013.01)

(58) Field of Classification Search
CPC ..... F21V 29/503; F21V 29/70; H05K 1/0203; H05K 1/05
USPC ........................................ 362/235, 241, 294
See application file for complete search history.

(56) References Cited

U.S. PATENT DOCUMENTS

| | | | |
|---|---|---|---|
| 9,310,045 B2* | 4/2016 | Odnoblyudov | ........... F21V 7/22 |
| 2010/0133578 A1* | 6/2010 | Pickard | ................... F21V 29/70 |
| | | | 257/99 |

(Continued)

*Primary Examiner* — Paultep Savusdiphol
(74) *Attorney, Agent, or Firm* — Yutian Ling

(57) ABSTRACT

Examples of the present disclosure are related to systems and methods for lighting fixtures. More particularly, embodiments disclose lighting fixtures utilizing metal core PCB (MCPCB) for thermal, mechanical, and/or optical controls.

18 Claims, 7 Drawing Sheets

Related U.S. Application Data

(60) Provisional application No. 62/516,412, filed on Jun. 7, 2017.

(51) Int. Cl.

| | | |
|---|---|---|
| F21V 29/70 | (2015.01) | |
| F21V 29/83 | (2015.01) | |
| F21K 9/232 | (2016.01) | |
| A01G 7/04 | (2006.01) | |
| F21V 7/00 | (2006.01) | |
| F21V 7/05 | (2006.01) | |
| H05K 3/00 | (2006.01) | |
| H05K 3/28 | (2006.01) | |
| H05K 3/44 | (2006.01) | |
| F21S 4/28 | (2016.01) | |
| F21V 15/015 | (2006.01) | |
| F21V 17/10 | (2006.01) | |
| F21V 19/00 | (2006.01) | |
| F21V 23/02 | (2006.01) | |
| F21Y 115/10 | (2016.01) | |
| H05B 45/10 | (2020.01) | |
| H05B 47/19 | (2020.01) | |
| H05B 47/105 | (2020.01) | |
| F21Y 105/16 | (2016.01) | |
| F21Y 103/10 | (2016.01) | |

(56) References Cited

U.S. PATENT DOCUMENTS

| | | | |
|---|---|---|---|
| 2011/0235321 A1* | 9/2011 | Ivey | F21V 29/85 |
| | | | 362/218 |
| 2012/0201024 A1* | 8/2012 | van de Ven | F21S 4/26 |
| | | | 362/231 |
| 2015/0043206 A1* | 2/2015 | Donegan | F21V 7/048 |
| | | | 362/235 |
| 2015/0285483 A1* | 10/2015 | Kjaer | F21V 29/677 |
| | | | 362/373 |
| 2016/0033105 A1* | 2/2016 | Odnoblyudov | F21V 7/05 |
| | | | 362/249.02 |

* cited by examiner

SYSTEMS AND METHODS FOR LIGHTING FIXTURES

CROSS-REFERENCE TO RELATED APPLICATIONS

This application is a continuation of U.S. patent application Ser. No. 15/684,665, entitled "Systems and Methods for Lighting Fixtures," filed Aug. 23, 2017, which claims a benefit of priority under 35 U.S.C. § 119 to Provisional Application No. 62/516,412 filed on Jun. 7, 2017, each of which is fully incorporated herein by reference in their entirety.

BACKGROUND INFORMATION

Field of the Disclosure

Examples of the present disclosure are related to systems and methods for lighting fixtures. More particularly, embodiments disclose lighting fixtures utilizing bends in heat sink device comprised of metal-core PCB (MCPCB) for thermal, mechanical, and/or optical controls.

Background

Controlled environment agriculture, especially vertical farming is becoming more prevalent in the US and around the world. Vertical farming relies on light fixtures to illuminate a plant canopy. The light fixtures uniformly distribute radiant flux over the plant canopy, while removing heat from light sources (typically LEDs). The light fixtures' efficacy and cost directly impacts the operational expenses associated with vertical farming. As fixture height directly influences a number of vertical layers within a growth volume, it is important to minimize a form factor or vertical height of the fixture Operating higher-powered lights in a vertical growth is more costly than utilizing free sunlight in greenhouses or field-grown. To overcome these costs, vertical farming must have increased yields, shorter growth cycles, more consistent product, less water usage, reduce farm to plate timeframe, higher nutrient content, and other tangible advantages.

Although light emitting diodes (LEDs) used in vertical farming are more efficient than traditional higher-powered lights, their manufacturing costs are also higher. Additionally, their performance is negatively impacted with thermal rise. The terminal rise requires the light fixtures to dissipate heat more efficiently. This generated heat causes issues such as decreased longevity and lower fixture efficacy. To circumvent the requirements to dissipate the heat, some manufacturers have built complex LED fixtures. This has led to conventional LED fixtures being coupled to heat sinks.

Conventional LED fixtures utilize LEDs that are positioned on a printed circuit board. PCB substrates may be made of different materials such as FR4, Aluminum, copper, etc. In most application, an insulative substrate is necessary such as FR4. In higher powered applications, a highly thermally conductive substrate is desired. For LEDs, thermal dissipation is paramount and therefore Aluminum substrates are often utilized. When metal is used as the substrate, the term metal core printed circuit board is used or more commonly MCPCB.

Conventionally, a linear MCPCB is coupled to the heatsink to dissipate generated heat, wherein the linear heatsink may include fins to dissipate heat. However, the fins may act as heat blocks and prevent air from reaching the hot surface. Thus, linear heatsinks with fins may lead to inefficient thermal transfer or increased thermal resistance between the heat source (LEDs) and the environment. Moreover, process to affix the LEDs to the MCPCB and then to couple the MCPCB to the heat sink requires time and resources. This can be an arduous, time consuming, and costly task.

Accordingly, needs exist for more effective and efficient systems and methods for light fixtures with LEDS integrated directly into MCPCB, wherein the MCPCB includes one or more bends for mechanical strength, aesthetics, thermal controls, and/or optical controls.

SUMMARY

Embodiments disclosed herein describe systems and methods for a light fixture that utilizes MCPCB for thermal, mechanical, and/or optical controls. In embodiments, a substrate, such as a MCPCB sheet, may be directly populated with electronic components, such as LEDS, connectors, fuses, etc. The MCPCB sheet may then be coated for protection. The MCPCB sheet may then be cut into a single panel. Next, the single panel MCPCB is bent at least one time, wherein the bend may increase the rigidity and mechanical strength of the system, be more aesthetically pleasing, and allow for thermal and optical controls. The bent MCPCB panel can then be assembled into a light fixture. Furthermore, utilizing the bends of the MCPCB, the light fixture may control the air flow of heated air towards a central axis of the light fixture above the light sources. Thus, the MCPCB light fixture may effectively and efficiently dissipate heat generated by the LEDS due to the MCPCB being the heat sink, which may not create interface losses between the MCPCB and the heatsink.

Embedded light sources and corresponding electronics directly with a MCPCB may allow for lower material costs, lower labor costs, and superior thermal performance. Specifically, costs may be reduced by not requiring heatsink, adhesives, or other thermal interface materials. Additionally, costs may be reduced by not requiring fasteners, clips, etc. to couple the heatsink to the MCPCB.

Labor costs may also be reduced by removing the steps of adhesive dispensing or tape dispensing, MCPCB placement process, and time to cure or set the adhesive or tape.

Embodiments may include a MCPCB panel, at least one row of LEDs, and at least one bend in the MCPCB panel.

The MCPCB panel may be formed of copper, 3003 AL, 5052 AL, and/or other desired metals. In implementations, the preferred MCPCB may not be formed of a metal with a very low emissivity. To increase the emissivity of the MCPCB panel, the panel may be anodized, may have a solder mask that yields higher emissivity than anodized aluminum, and/or have a painted surface that yields higher emissivity than anodized aluminum.

The row(s) of LEDs may be positioned from a first end to a second end of the MCPCB panel, which may extend along the longitudinal axis of the MCPCB panel. The rows of LEDs may be symmetrically or asymmetrically spaced from the central axis of the MCPCB panel. Symmetrical implementations of the positioning of the LEDs may allow for even and symmetrical heat transfer, distribution, etc. from the LEDs, and/or allow for desired optical controls.

The bends in the MCPCB may extend from the first end to the second end of the MCPCB panel. The bends may be configured to add rigidity and/or mechanical strength, add form for aesthesis, and allow for thermal and optical controls, such as being a diffuse/specular reflector. The bends in the MCPCB may be downward and outwardly angled bends, which are configured to extend away from the central axis of the MCPCB panel towards a lower surface. The angle of the bends may direct air to flow from a position below the MCPCB panel towards the central axis of the MCPCB above the LEDs.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
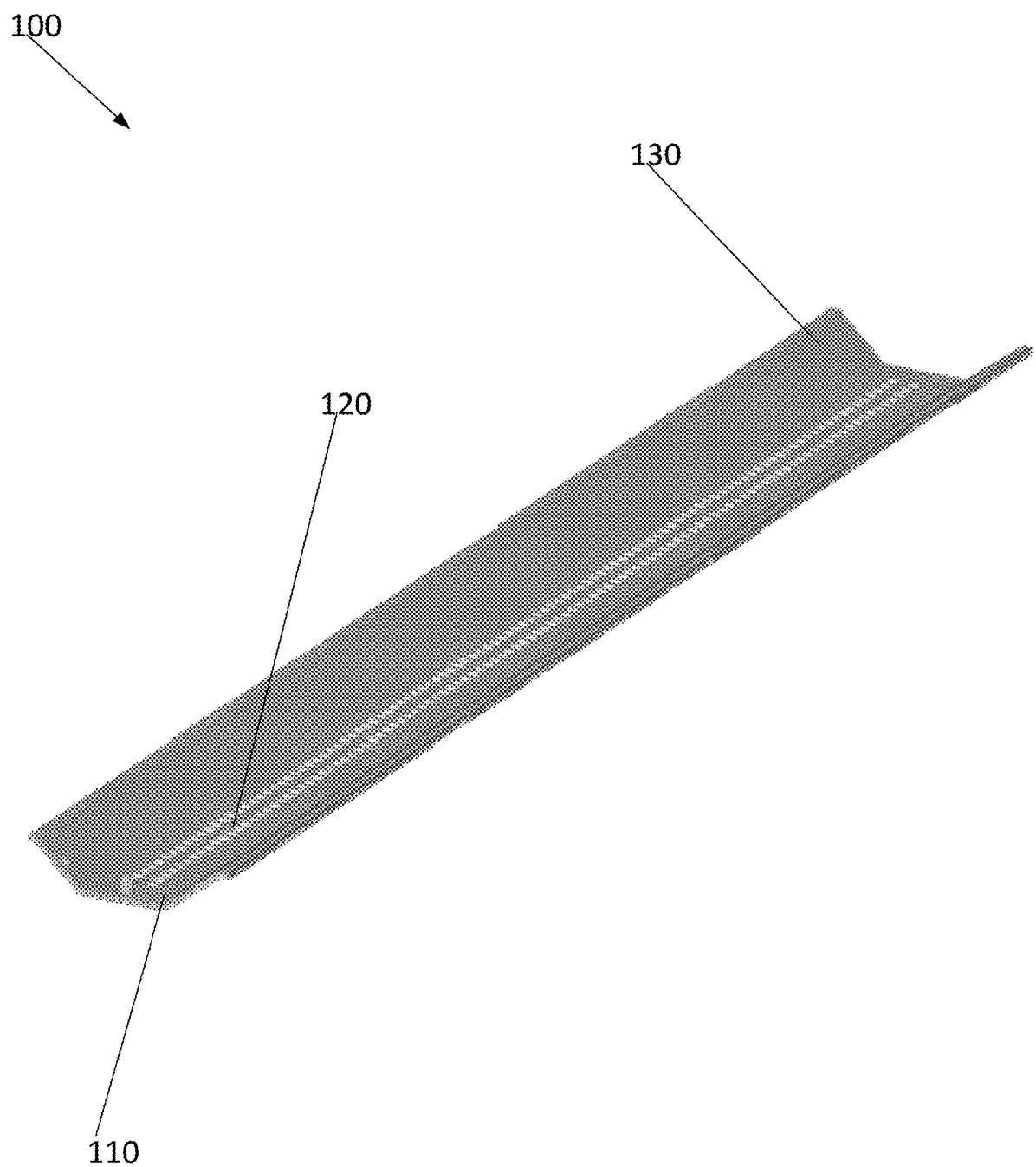
FIG. 1 depicts a heat sink system, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

FIG. 1 depicts a heat sink system 100, according to an embodiment. System 100 may be configured to utilize bends in a MCPCB lighting fixture for thermal, mechanical, and optical controls. System 100 may include MCPCB 110, light sources 120, and bends 130. Utilizing bends 130, MCPCB 110 may be substantially isothermal having somewhat uniform temperatures across MCPCB 110.

MCPCB 110 may be formed of any metal, including: copper, 3003 AL, 5052 AL, and/or other desired metals. In specific implementations, MCPCB 110 may be formed of a metal or substrate with a very low emissivity. However such a system would be much larger than a system with a high emissivity platform. To increase the emissivity of the MCPCB 110, MCPCB 110 may be anodized, may have a solder mask that yields higher emissivity that anodized aluminum, and/or have a painted surface that yields higher emissivity than anodized aluminum. MCPCB 110 may be positioned in a panel having a longer longitudinal axis than a lateral axis. MCPCB 110 may have a thickness that is based on the thermal properties generated by light sources 120. For example, MCPCB 110 may have a thickness that is around 1.6 mm. MCPCB 110 may include a conformal coating comprised of a solder mask, which may be white or another color. MCPCB 110 may also include specular reflectors, diffuse reflectors, and engineered diffusers for beam control.

Light sources 120 may be light emitting diodes (LEDs) or any other device that is configured to emit light. Light sources 120 may be directly embedded or positioned on MCPCB 110, such that additional operations to affix tape or thermal adhesives to MCPCB 110, a heat sink, or both are not required. Light sources 120 may be positioned from a first end of MCPCB 110 to a second end of MCPCB 110. Light sources 120 may be configured to generate heat in response to creating and emitting light. Light sources 120 may be arranged on MCPCB 110 in a plurality of rows, or in any predetermined layout to generate a desired light pattern on an area of interest positioned below system 100. In embodiments, the rows of light sources 120 may be symmetrically placed around and/or through the central axis of MCPCB 110 to emit an even light pattern and to generate even amounts of heat. However, in other embodiments, the lights sources 120 may be asymmetrically positioned to generate a desired light pattern on a region of interest. In embodiments, reflectors and diffusers may be positioned around light sources 120 after the light sources 130 are positioned on MCPCB 110, which may be before the conformal coating layered on MCPCB 110.

Bends 130 may be positioned from the first end to the second end of MCPCB 110. Bends 130 may be configured to add rigidity and/or mechanical strength to system 100, add form for aesthetics, operate as a heat sink to guide the flow of air, and allow for optical controls. Bends 130 may be positioned at an angle that is perpendicular to MCPCB 110 or positioned at an angle that is downward and away from a central axis of MCPCB 110. By angling bends 130 away from the central axis and towards a lower surface, thermal performance of system 100 may be increased. More specifically, air that is heated by light sources 120 (and other electronics) under MCPCB 110, may travel towards the lower distal ends of bends 130, around the distal ends of bends 130, and upwards towards the central axis of system 100 positioned above MCPCB 110. In embodiments, reflectors may be positioned on bends 130.

The heights of bends 130 may be based on the length of MCPCB 110, wherein the heights of bends may be the vertical distance from the distal ends of bends 130 to the upper surface of MCPCB 110. In embodiments where the length of MCPCB 110 is longer, the height of bends 130 may be taller. In embodiments where the length of MCPCB 110 is shorter, the height of bends 130 may be shorter.

In embodiments, based on the geometric properties of bends 130, bends 130 may be utilized for optical control of the light emitted from light sources 120. Specifically, the bends 130 may be used as a diffuse/speculator reflector for the light emitted from light sources 120. This may enable system 100 to alter, change, and/or create a desirable light pattern on an area of interest below system 100.

In embodiments, the angles, lengths, heights, and/or other geometrical properties of bends 130 may be symmetrical across the central axis such that MCPCB 110 is isothermal. Yet, in other implementations, the angles, lengths, heights, and/or other geometric properties of bends 130 may be asymmetric. For example, different systems may be created with different geometric layouts. For example, system 100 may only include one row of light sources extending along the central axis of the MCPCB. Additionally, the length of the bends in other systems may be shorter than that of system 100, and the spacing of the lights in other systems may be different than that of system 100. The geometric properties of the different systems may be utilized for optical controls to emit different desired light patterns on different areas of interest.

Figure 2:
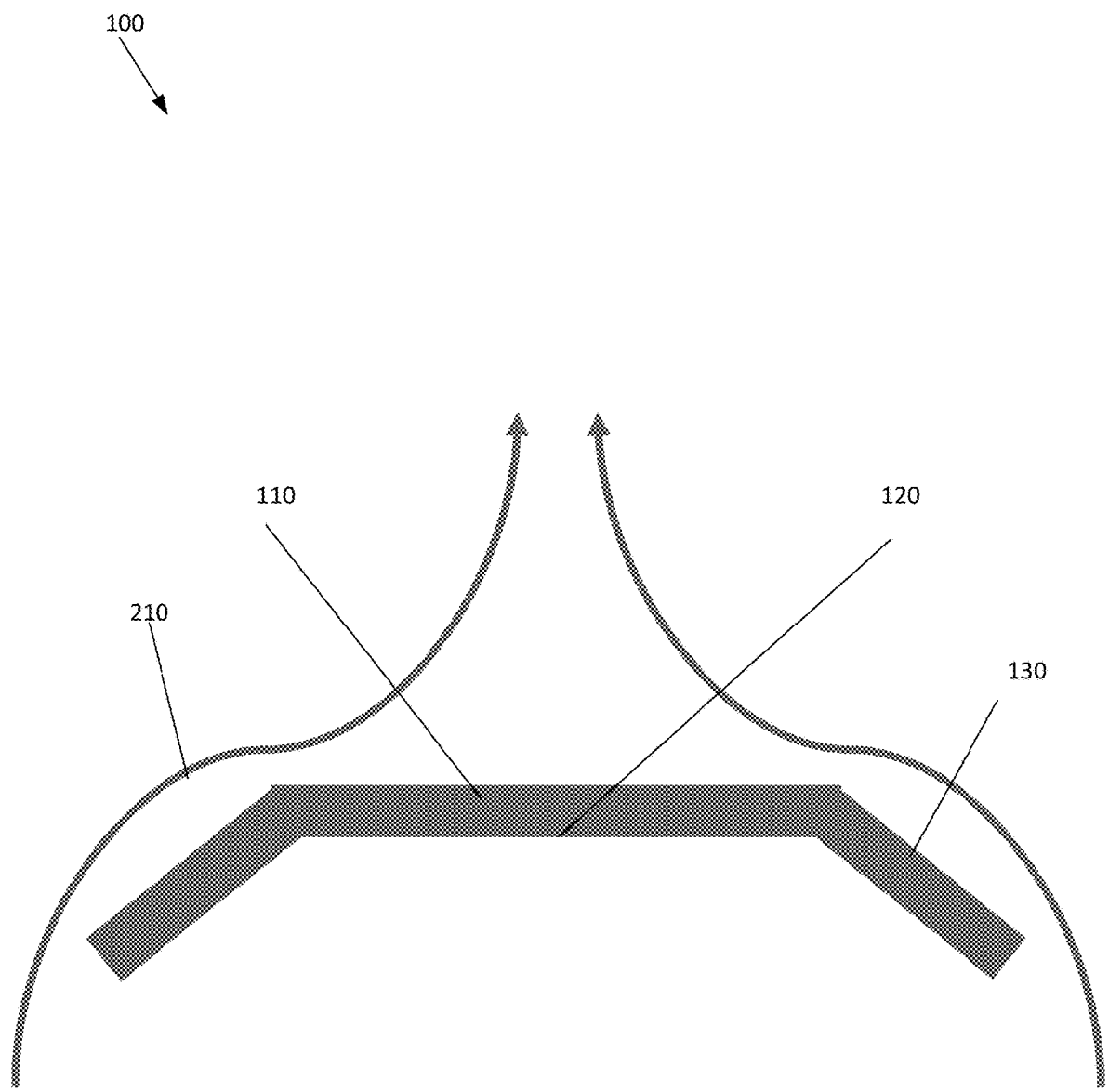
FIG. 2 depicts thermal performance of a heat sink system, according to an embodiment.

FIG. 2 depicts thermal performance of system 100, according to an embodiment. Elements depicted in FIG. 2 may be described above, and for the sake of brevity an additional description of these elements is omitted.

As depicted in FIG. 2, the heat generated by light sources 120 may be substantially isothermally distributed to MCPCB 110. This may cause the heat across MCPCB 110 to be somewhat uniform. As heat is generated by light sources 120, the heated air below system 100 may flow 210 around the distal ends of bends 130 towards the central axis of MCPCB 110. Due to the geometry of bends 130, the flowing air 210 may more efficiently be dissipated into the surrounding environment above and away from MCPCB 110.

Figure 3:
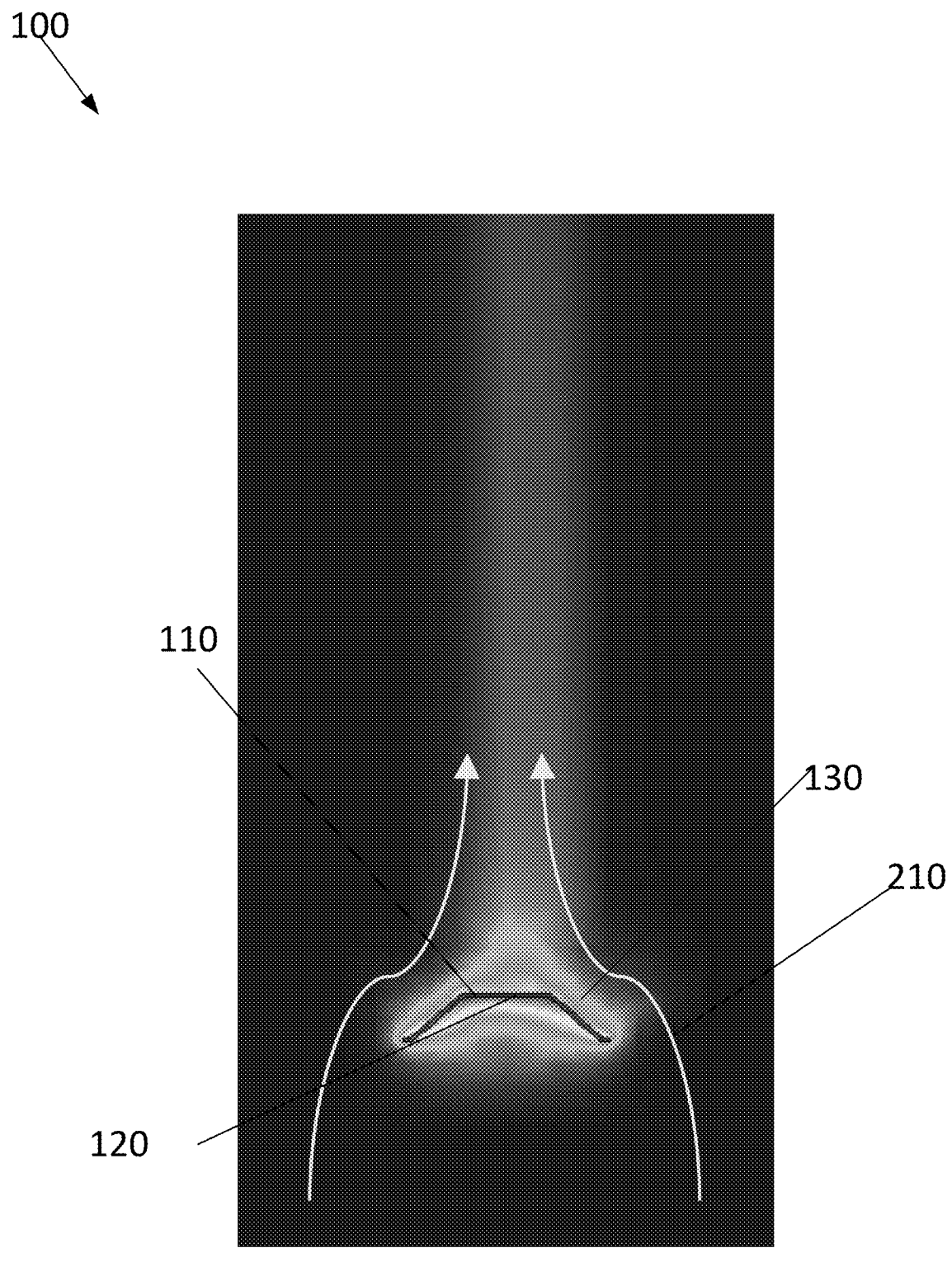
FIG. 3 depicts thermal performance of a heat sink system, according to an embodiment.

FIG. 3 depicts thermal performance of system 100, according to an embodiment. Elements depicted in FIG. 3 may be described above, and for the sake of brevity an additional description of these elements is omitted.

More specifically, FIG. 3 depicts a more detail view of the air flow 210 generated and directed around system 100. As depicted in FIG. 3, a somewhat isothermal distribution around system 100.

Figure 4:
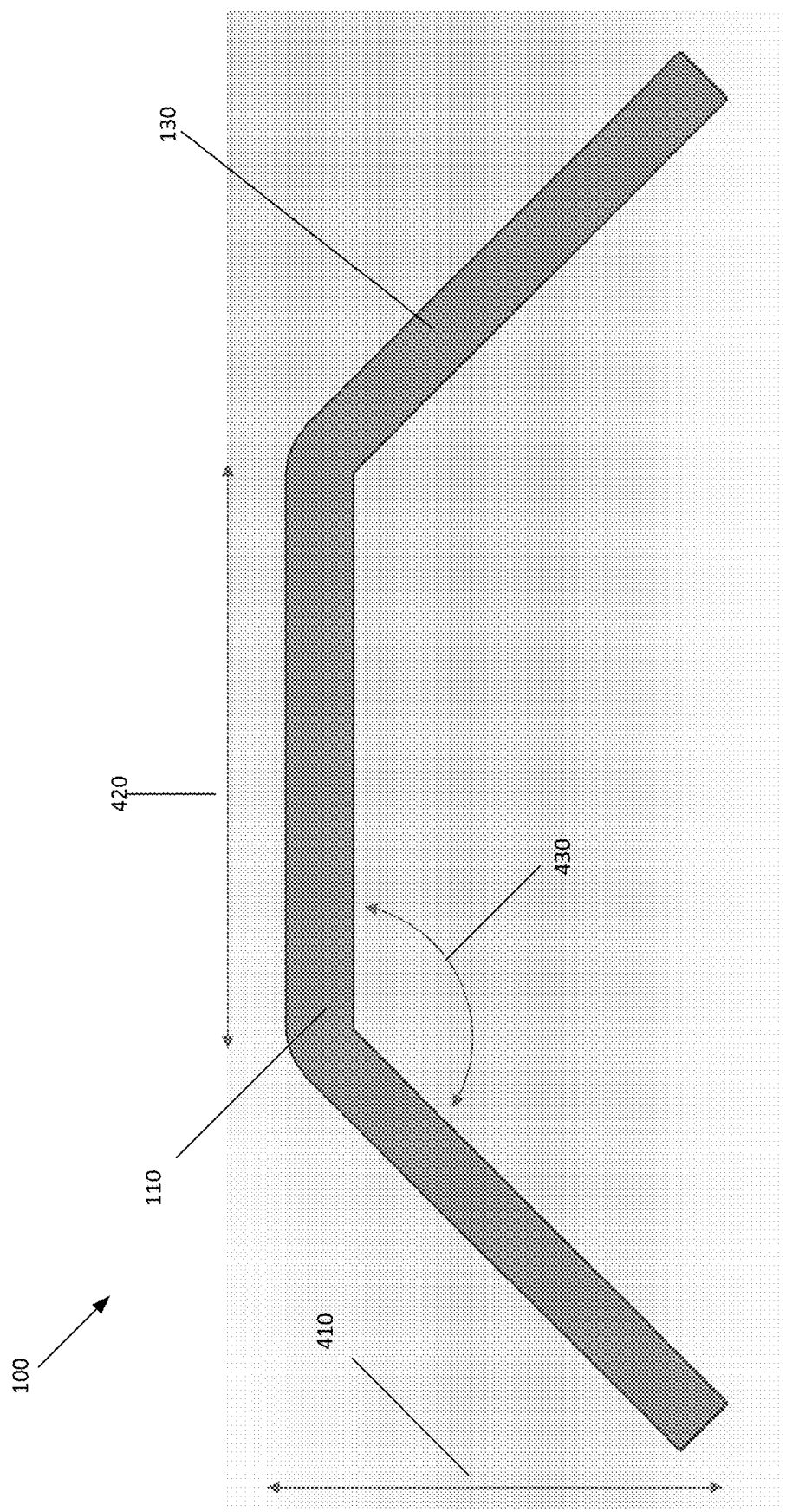
FIG. 4 depicts a front view of a heat sink system, according to an embodiment.

FIG. 4 depicts a front view of system 100, according to an embodiment. Elements depicted in FIG. 4 may be described above, and for the sake of brevity an additional description of these elements is omitted.

In embodiments, the top heat dissipation surface area of system 100 may be based in part on the total height 410, top width 420 of MCPCB 110, and the angle 430 between the planar surface and bends 130 of MCPCB 110. For example, the top heat dissipation surface area of system 100 may be equal to two times height 410 divided by the sin (180-angle 430), plus width 420, multiplied by the length along the longitudinal axis of MCPCB 110. Furthermore, the mechanical rigidity of system 100 may be based on height 410 of bends 130, wherein increasing height 410 may increase the mechanical rigidity along the length of MCPCB 110. Accordingly, top heat dissipation surface area of system 100 may be correlated with the mechanical strength of system 100.

In embodiments, the total height, total width, and angle 430 may be dependent on each other based on the top heat dissipation surface area, while height 410 and width 420 may be independent of each other, wherein height 410 may be modified based on a desired rigidity of MCPCB 110 and width 420 based on desired heat sinking of MCPCB 110. Accordingly, if you have a desired heat sinking rating of MCPCB 110, width 420 may be selected, while the height 410 may float to a desired variable to maximize the top heat dissipation surface.

Figure 5:
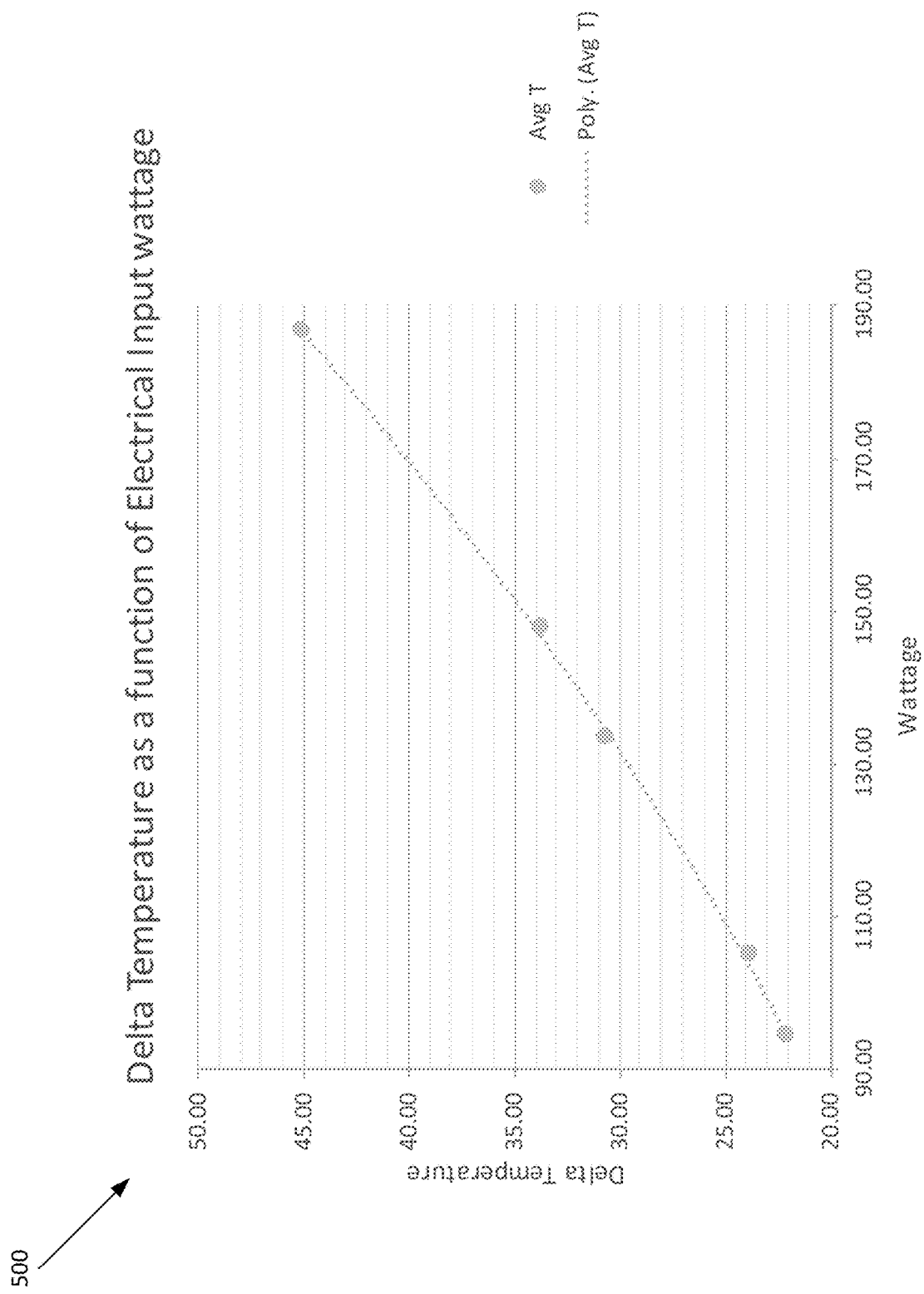
FIG. 5 depicts a graph of a change in temperature (y-axis) as a function of electrical input wattage (x-axis), according to an embodiment.

FIG. 5 depicts a graph 500 of a change in temperature (y-axis) as a function of electrical input wattage (x-axis), according to an embodiment. More specifically, graph 500 depicts the change in temperature associated with LEDS on system 100 based on wattage.

As depicted in graph 500, as the wattage applied to system 100 and corresponding LEDs increases, the temperature associated with system 100 also increases.

Figure 6:
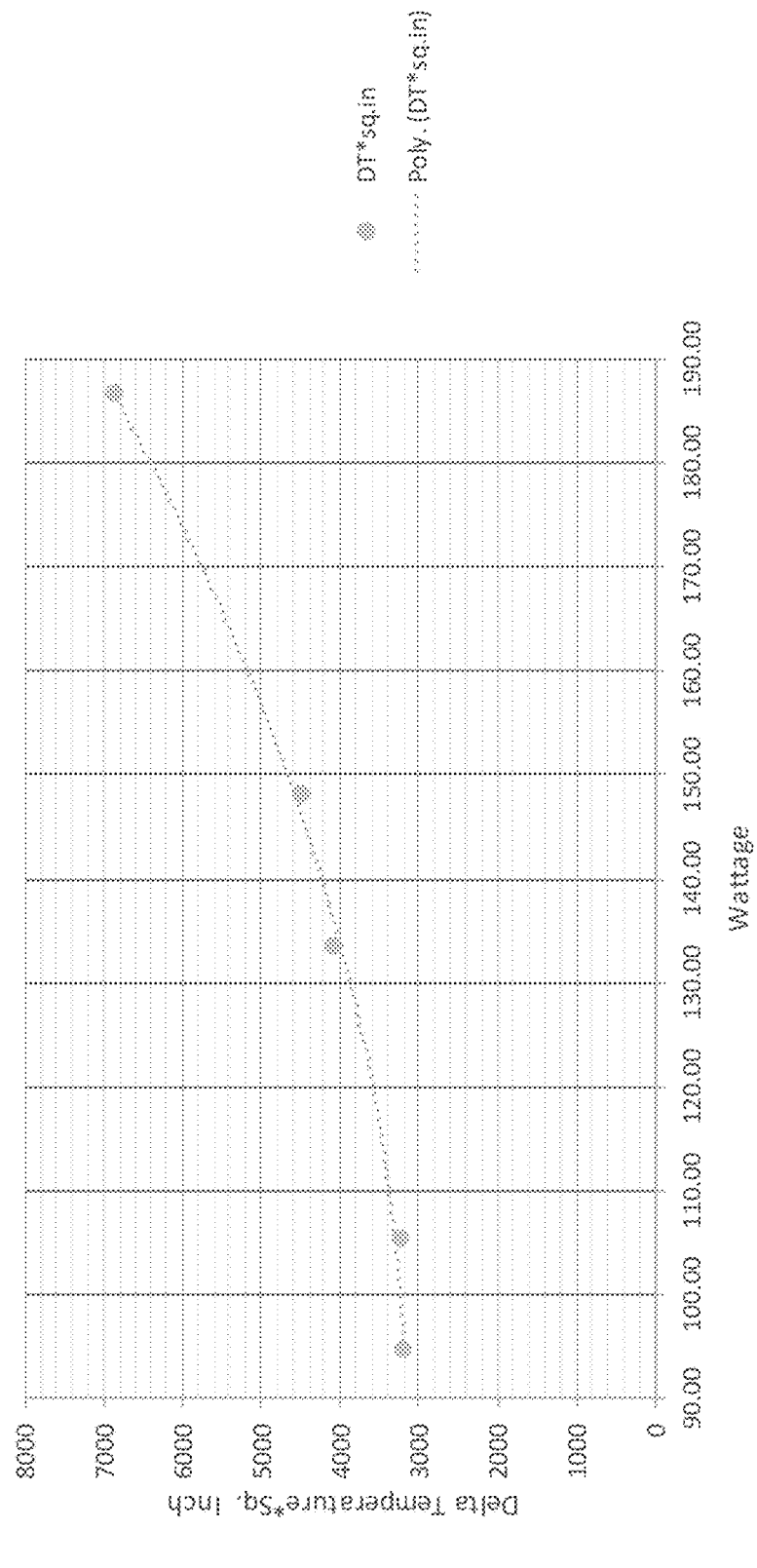
FIG. 6 depicts a graph of a change in temperature per square inch (y-axis) as a function of electrical input wattage (x-axis), according to an embodiment.

FIG. 6 depicts a graph 600 of a change in temperature per square inch (y-axis) as a function of electrical input wattage (x-axis), according to an embodiment. More specifically, graph 600 depicts the change in temperature associated with LEDs within system 100 based on wattage.

As depicted in graph 600, as the wattage applied to system 100 and corresponding LEDs increases, the temperature per square inch associated with system 100 also increases.

In implementations, upon determining the wattage to the LEDs in system 100, metrics as shown in graph 600 may be utilized to determine the delta temperature per square inch and the delta temperature utilizing graph 500. The delta temperature per square inch may be divided by the delta temperature to determine the top heat dissipation surface area. Then, utilizing constraining factors such as length (or the other variables), the other geometrical properties can be determined.

Figure 7:
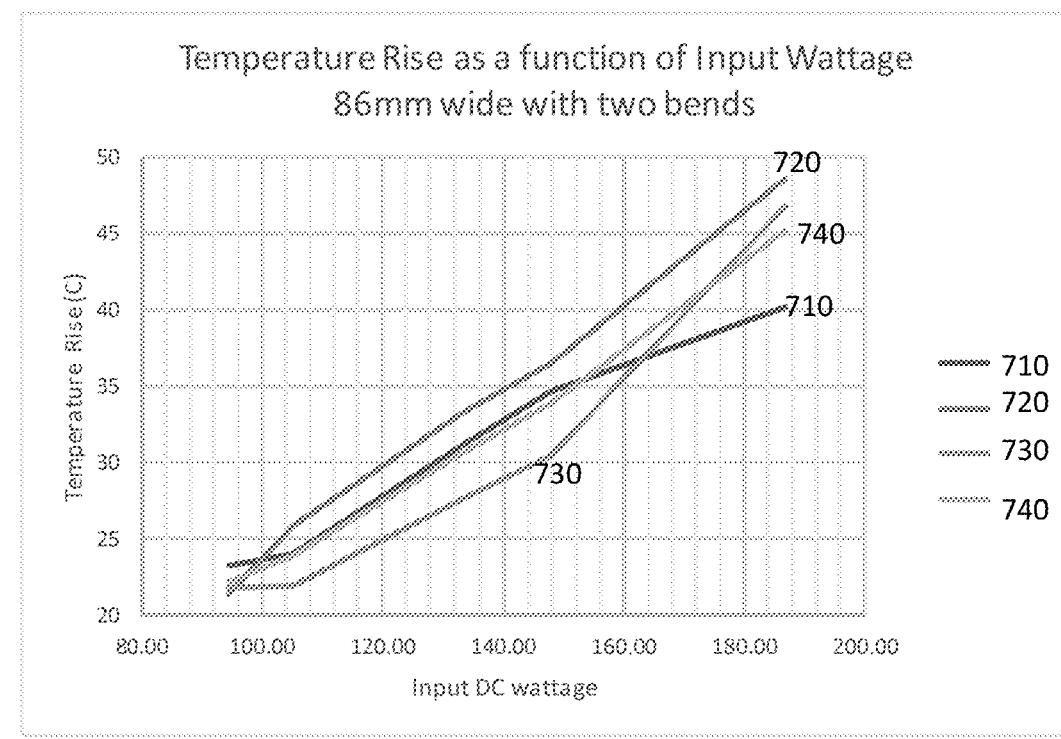
FIG. 7 depicts a graph 700 of thermal performance of a heat sink system, according to an embodiment.

FIG. 7 depicts a graph 700 of thermal performance of system 100, according to an embodiment. Elements depicted in FIG. 7 may be described above, and for the sake of brevity an additional description of these elements is omitted.

More specifically, table 700 depicts temperature rise (Y-axis) of system 100 as a function of input wattage (X-axis) on system 100 with two bends. Table 700 includes data points of temperatures at three different locations 710, 720, 730 along the central axis of system and an average 740 of the recorded temperatures. As depicted in table 700, the temperature from the first to the second end of MCPCB 110 is substantially linear and isothermal irrespective of the locations of the temperature recordings. Furthermore, as the wattage to the light sources increase, the temperatures across data points 710, 720, 730 corresponding increases linearly.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A heat sink comprising:
   a substrate;
   at least one light source positioned on a first surface of the substrate; and
   at least one bend extending along a longitudinal axis of the substrate;
   wherein a top heat dissipation surface area of the heat sink is based in part on:
      a height of the at least one bend, wherein the height of the bend is based in part on a length of the heat sink;
      a width of a second surface of the substrate; and
      an angle between the first surface of the substrate and the at least one bend.

2. The heat sink of claim 1, wherein a mechanical rigidity of the heat sink is based on the height of the bend.

3. The heat sink of claim 2, wherein the mechanical rigidity of the heat sink is in a direction perpendicular to a direction of the bend.

4. The heat sink of claim 1, wherein increasing the width of the second surface increases the top heat dissipation surface area of the heat sink.

5. The heat sink of claim 1, wherein the substrate is metal-core printed circuit board.

6. The heat sink of claim 1, further comprising:
   a first bend; and
   a second bend, the first bend and the second bend being position on different sides of the at least one light source, the first bend and the second bend being asymmetrical.

7. The heat sink of claim 1, further comprising:
   a coating positioned on the second surface of the substrate;
   reflectors positioned on the second surface of the substrate, wherein the reflectors are positioned on the second surface of the substrate before the coating.

8. The heat sink of claim 7, wherein the reflectors are positioned around the at least one light surface.

9. The heat sink of claim 8, wherein the reflectors are positioned on the at least one bend.

10. A method for dissipating heat using a heat sink comprising:
    positioning at least one light source on a first surface of the substrate;
    positioning at least one bend extending along a longitudinal axis of the substrate, wherein a top heat dissipation surface area of the heat sink is based in part on:
       a height of the at least one bend, wherein the height of the bend is based in part on a length of the heat sink;
       a width of a second surface of the substrate; and
       an angle between the first surface of the substrate and the at least one bend;
    generating heat, via the at least one light source;
    flowing the heat around the at least one bend.

11. The method of claim 10, further comprising:
    increasing a mechanical rigidity of the heat sink by increasing the height of the bend.

12. The method of claim 11, wherein the mechanical rigidity of the heat sink is in a direction perpendicular to a direction of the bend.

13. The method of claim 10, wherein increasing the width of the second surface increases the top heat dissipation surface area of the heat sink.

14. The method of claim 10, wherein the substrate is metal-core printed circuit board.

15. The method of claim 10, wherein the substrate includes a first bend, and a second bend, the first bend and the second bend being position on different sides of the at least one light source, the first bend and the second bend being asymmetrical.

16. The method of claim 10, further comprising:
    positioning reflectors on the second surface of the substrate
    positioning a coating positioned on the second surface of the substrate after the reflectors are positioned on the second surface of the substrate.

17. The method of claim 16, wherein the reflectors are positioned around the at least one light surface.

18. The method of claim 17, wherein the reflectors are positioned on the at least one bend.

* * * * *